US011025034B2

(12) United States Patent
Hodges et al.

(10) Patent No.: US 11,025,034 B2
(45) Date of Patent: Jun. 1, 2021

(54) LASER COOLING SYSTEM

(71) Applicant: NLIGHT, INC., Vancouver, WA (US)

(72) Inventors: Aaron Ludwig Hodges, La Center, WA (US); Rodney Mark Stephens, Hillsboro, OR (US)

(73) Assignee: NLIGHT, INC., Vancouver, WA (US)

( * ) Notice: Subject to any disclaimer, the term of this patent is extended or adjusted under 35 U.S.C. 154(b) by 112 days.

(21) Appl. No.: 15/688,762

(22) Filed: Aug. 28, 2017

(65) Prior Publication Data
US 2018/0062347 A1 Mar. 1, 2018

Related U.S. Application Data

(60) Provisional application No. 62/382,034, filed on Aug. 31, 2016.

(51) Int. Cl.
F28F 1/22 (2006.01)
F28F 9/013 (2006.01)
(Continued)

(52) U.S. Cl.
CPC ........ H01S 5/02423 (2013.01); B23K 26/703 (2015.10); F28D 15/04 (2013.01);
(Continued)

(58) Field of Classification Search
CPC ..... F28D 2021/0029; F28D 2021/0028; F28D 15/00; F28F 1/22; F28F 9/0131;
(Continued)

(56) References Cited

U.S. PATENT DOCUMENTS 1,245,674 A * 11/1917 Bushnell ................... F28F 1/22
165/171
2,334,219 A 11/1943 Roth
(Continued)

FOREIGN PATENT DOCUMENTS

DE 4315580 A1 11/1994
DE 102007023058 A1 * 10/2008 ........... F28D 1/0477
(Continued)

OTHER PUBLICATIONS

European Patent Office, Rijswik; International Search Report and Written Opinion for PCT/US17/066453; dated May 15, 2018; 15 pages.
(Continued)

Primary Examiner — Jianying C Atkisson
Assistant Examiner — Miguel A Diaz
(74) Attorney, Agent, or Firm — Schwabe Williamson & Wyatt

(57) ABSTRACT

A laser cooling system includes a first tubing, a second tubing, and a cold plate assembly including a first channel to receive the first tubing and a second channel to receive the second tubing. A joint removably couples the first tubing to the second tubing and at least one component mounted on the cold plate assembly over the first tubing or the second tubing. The inlet end of the first tubing receives a cooling fluid and an outlet end of the second tubing discharges the cooling fluid after the cooling fluid flows through the first tubing, the joint, and the second tubing to maintain uniform a temperature of the at least one component mounted on the cold plate assembly.

19 Claims, 10 Drawing Sheets

Figure 1A:
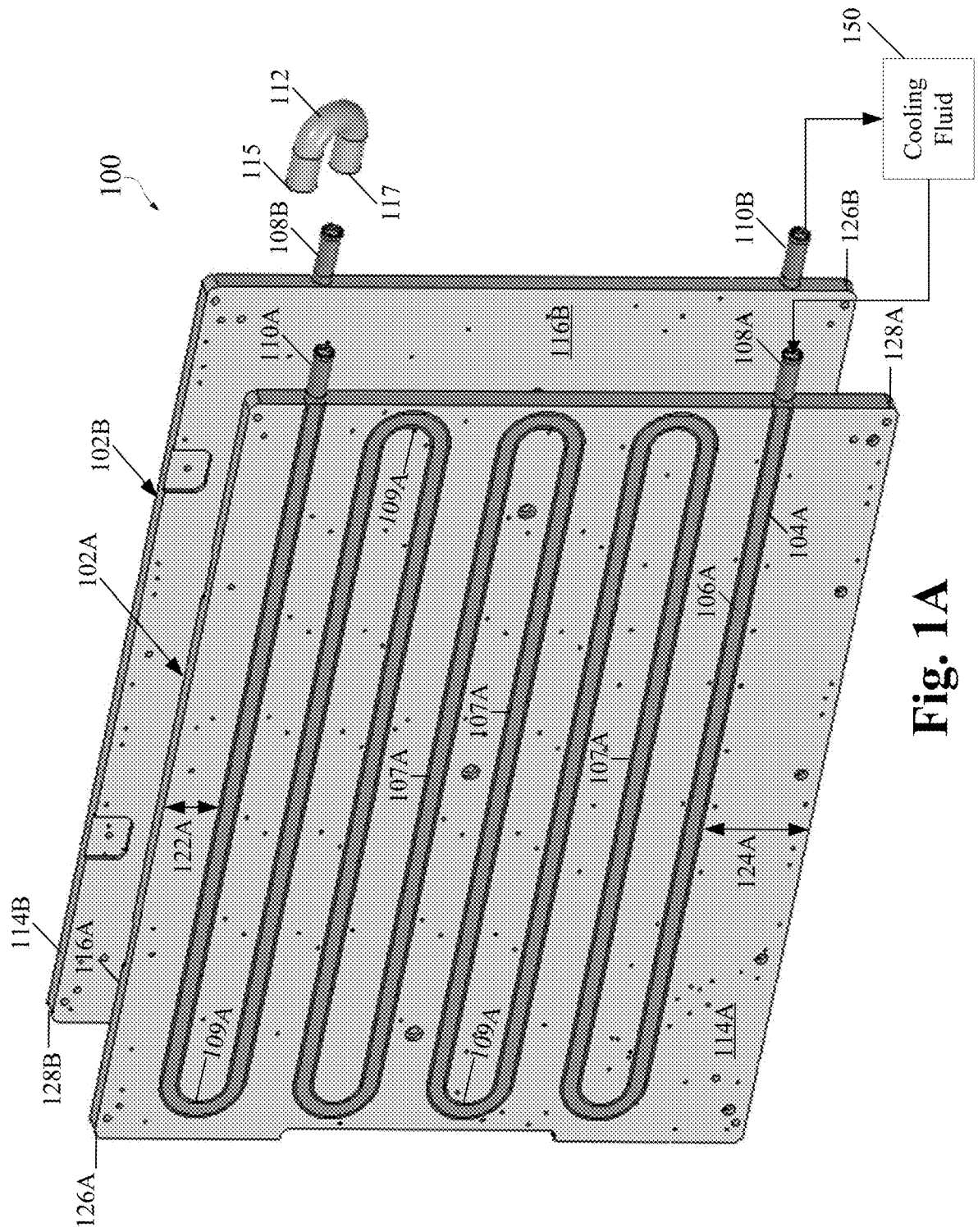

(51) Int. Cl.

| | | |
|---|---|---|
| *F28D 15/02* | (2006.01) | |
| *F28D 21/00* | (2006.01) | |
| *F28D 15/00* | (2006.01) | |
| *H01S 5/024* | (2006.01) | |
| *B23K 26/70* | (2014.01) | |
| *F28D 15/04* | (2006.01) | |
| *H01S 3/04* | (2006.01) | |
| *H01S 5/40* | (2006.01) | |
| *H01L 23/473* | (2006.01) | |

(52) U.S. Cl.
CPC .............. *F28F 1/22* (2013.01); *F28F 9/0131* (2013.01); *H01S 3/0402* (2013.01); *H01S 5/02438* (2013.01); *F28D 15/00* (2013.01); *F28D 15/0275* (2013.01); *F28D 2021/0028* (2013.01); *F28D 2021/0029* (2013.01); *H01L 23/473* (2013.01); *H01S 5/4025* (2013.01)

(58) Field of Classification Search
CPC ........ F28F 3/08; F28F 3/086; H05K 7/20254; H05K 7/20509; F24D 5/10; F24D 3/12; F24D 3/14; F24D 3/125; F24D 3/142; B23K 26/703; H01S 5/02423; H01S 3/0402; H01S 3/0405
See application file for complete search history.

(56) References Cited

U.S. PATENT DOCUMENTS

| | | | |
|---|---|---|---|
| 3,279,532 A | 10/1966 | Pfeil | |
| 3,334,684 A * | 8/1967 | Mazorol, Jr. | F25D 15/00 165/47 |
| 4,338,995 A * | 7/1982 | Shelley | F24D 3/165 165/49 |
| H239 H * | 3/1987 | Franklin | F24D 3/142 165/47 |
| 4,712,158 A * | 12/1987 | Kikuchi | H01L 23/4735 361/699 |
| 4,724,316 A | 2/1988 | Morton | |
| 4,865,123 A * | 9/1989 | Kawashima | H05K 7/20272 165/104.33 |
| 5,005,640 A | 4/1991 | Lapinski | |
| 5,043,797 A * | 8/1991 | Lopes | H01L 23/473 165/104.33 |
| 5,088,005 A * | 2/1992 | Ciaccio | H05K 7/20636 165/104.33 |
| 5,144,531 A * | 9/1992 | Go | H01L 23/473 165/80.4 |
| 5,173,957 A | 12/1992 | Bergano | |
| 5,222,170 A | 6/1993 | Bargar | |
| 5,241,414 A | 8/1993 | Giles | |
| 5,333,230 A | 7/1994 | Hata et al. | |
| 5,509,468 A * | 4/1996 | Lopez | F28F 3/12 165/144 |
| 5,594,748 A | 1/1997 | Jabr | |
| 5,731,568 A * | 3/1998 | Malecek | B60H 1/00278 180/68.5 |
| 5,785,754 A | 7/1998 | Yamamoto | |
| 5,829,516 A * | 11/1998 | Lavochkin | F28F 1/22 165/80.4 |
| 5,899,077 A * | 5/1999 | Wright | F25B 21/02 165/168 |
| 5,903,583 A | 5/1999 | Ullman | |
| 5,912,748 A | 6/1999 | Jander | |
| 6,311,764 B1 * | 11/2001 | Schulz | E02F 3/3677 165/56 |
| 6,351,381 B1 * | 2/2002 | Bilski | F28D 15/0266 165/104.33 |
| 6,393,853 B1 * | 5/2002 | Vukovic | H01L 23/473 165/80.4 |
| 6,442,312 B1 | 8/2002 | Terao et al. | |
| 6,517,221 B1 | 2/2003 | Xie | |
| 6,583,926 B1 | 6/2003 | Wu | |
| 6,683,892 B1 | 1/2004 | Yamaura et al. | |
| 6,802,366 B1 * | 10/2004 | Dillon | B21C 37/155 165/177 |
| 6,942,019 B2 * | 9/2005 | Pikovsky | F28F 3/12 165/170 |
| 7,913,331 B2 * | 3/2011 | Hartman | E03B 1/04 4/665 |
| 8,493,651 B1 | 7/2013 | Hu et al. | |
| 8,881,793 B2 * | 11/2014 | Huang | F28D 15/0275 165/104.33 |
| 8,971,359 B2 | 3/2015 | Creeden | |
| 9,285,125 B2 | 3/2016 | Lee | |
| 9,285,126 B2 * | 3/2016 | Buttignol | F24D 3/125 |
| 9,693,489 B2 * | 6/2017 | Park | H05K 7/20927 |
| 9,774,063 B2 * | 9/2017 | Wayne | H01M 10/647 |
| 9,897,400 B2 * | 2/2018 | Yang | F28F 27/02 |
| 10,054,369 B2 * | 8/2018 | Yang | F28D 1/06 |
| 10,571,180 B2 * | 2/2020 | Knatt | B23P 15/26 |
| 2002/0001320 A1 | 1/2002 | Itoh | |
| 2003/0116869 A1 * | 6/2003 | Siu | F25B 21/02 257/653 |
| 2004/0258403 A1 | 12/2004 | Abras et al. | |
| 2005/0103472 A1 | 5/2005 | Lofland | |
| 2005/0113068 A1 | 5/2005 | Hoffman | |
| 2005/0128705 A1 * | 6/2005 | Chu | H01L 23/473 361/699 |
| 2005/0145680 A1 * | 7/2005 | Travassaros | F28D 1/0477 228/183 |
| 2005/0178530 A1 * | 8/2005 | Huang | H01L 23/473 165/80.4 |
| 2006/0002080 A1 | 1/2006 | Leija | |
| 2006/0027356 A1 | 2/2006 | Sulzer | |
| 2006/0108105 A1 | 5/2006 | Huang et al. | |
| 2006/0191838 A1 | 8/2006 | Lowell | |
| 2006/0196643 A1 * | 9/2006 | Hata | G06F 1/1616 165/104.33 |
| 2006/0254752 A1 * | 11/2006 | Narakino | F28D 1/0316 165/80.4 |
| 2007/0017656 A1 * | 1/2007 | Da Rold | F24D 3/125 165/48.1 |
| 2007/0017658 A1 * | 1/2007 | Lehman | H05K 7/20254 165/80.4 |
| 2008/0198880 A1 | 8/2008 | Munroe et al. | |
| 2009/0001185 A1 * | 1/2009 | Kroll | F24D 3/14 237/60 |
| 2009/0060444 A1 | 3/2009 | Muendel | |
| 2009/0222981 A1 * | 9/2009 | Hartman | E03B 1/04 4/313 |
| 2009/0266105 A1 | 10/2009 | Viklund | |
| 2009/0306831 A1 * | 12/2009 | Guggenmos | H01S 5/024 700/282 |
| 2010/0074586 A1 | 3/2010 | Panarello et al. | |
| 2010/0155040 A1 | 5/2010 | Hoffmann | |
| 2010/0247055 A1 | 9/2010 | Arashitani et al. | |
| 2010/0282442 A1 * | 11/2010 | Sukuvoy | B32B 15/06 165/104.19 |
| 2011/0168794 A1 * | 7/2011 | Lee | F24D 3/125 237/59 |
| 2012/0103580 A1 | 5/2012 | Buttignol | |
| 2012/0125573 A1 * | 5/2012 | Rubenstein | F28D 15/00 165/104.33 |
| 2012/0152493 A1 * | 6/2012 | Kao | F28D 15/00 165/100 |
| 2012/0268227 A1 * | 10/2012 | Howes | H01F 27/18 336/57 |
| 2012/0301097 A1 | 11/2012 | Nakano | |
| 2012/0318480 A1 * | 12/2012 | Lin | F28D 15/0233 165/104.26 |
| 2012/0320589 A1 * | 12/2012 | Wang | F28D 15/0275 362/249.02 |
| 2013/0291564 A1 * | 11/2013 | Ghoshal | F25B 21/02 62/3.6 |
| 2014/0231055 A1 * | 8/2014 | Schalansky | F28F 9/001 165/166 |
| 2014/0240818 A1 | 8/2014 | Taya | |

(56) References Cited

U.S. PATENT DOCUMENTS

| | | | | |
|---|---|---|---|---|
| 2014/0246174 | A1* | 9/2014 | Arvelo | F28F 1/00 |
| | | | | 165/104.11 |
| 2014/0248515 | A1* | 9/2014 | Wayne | H01M 10/655 |
| | | | | 429/82 |
| 2014/0362876 | A1 | 12/2014 | Schwarzenbach et al. | |
| 2015/0114612 | A1* | 4/2015 | Yang | F28D 1/06 |
| | | | | 165/168 |
| 2015/0114617 | A1* | 4/2015 | Yang | F28F 3/048 |
| | | | | 165/287 |
| 2015/0159884 | A1 | 6/2015 | Whang | |
| 2015/0237767 | A1* | 8/2015 | Shedd | H05K 7/20254 |
| | | | | 165/104.31 |
| 2015/0372451 | A1* | 12/2015 | Fulkerson | H01S 5/0427 |
| | | | | 372/35 |
| 2016/0003553 | A1* | 1/2016 | Campbell | H01M 10/6557 |
| | | | | 165/166 |
| 2016/0128240 | A1* | 5/2016 | Park | H05K 7/20927 |
| | | | | 361/699 |
| 2016/0273853 | A1* | 9/2016 | Schuster | G01F 1/34 |
| 2017/0082382 | A1* | 3/2017 | Mastinu | F28F 3/12 |
| 2017/0149203 | A1 | 5/2017 | Foley | |
| 2017/0170622 | A1 | 6/2017 | Kashiwagi | |
| 2017/0329092 | A1 | 11/2017 | Sanders | |
| 2018/0042137 | A1* | 2/2018 | Reeves | H01L 23/473 |
| 2018/0058777 | A1* | 3/2018 | Anderson | F28F 9/26 |
| 2018/0063992 | A1* | 3/2018 | Wan | F28F 3/14 |
| 2018/0172358 | A1* | 6/2018 | Moscatelli | F28D 15/043 |
| 2018/0175577 | A1 | 6/2018 | Hodges | |
| 2018/0340744 | A1* | 11/2018 | Tsai | F28F 3/02 |
| 2019/0099287 | A1* | 4/2019 | Vergara | A61F 7/0085 |
| 2019/0226769 | A1* | 7/2019 | Kao | F28D 15/043 |
| 2019/0239493 | A1* | 8/2019 | Liu | A01K 63/065 |
| 2020/0033043 | A1* | 1/2020 | Knatt | F25C 1/12 |

FOREIGN PATENT DOCUMENTS

| | | | | |
|---|---|---|---|---|
| DE | 102012216823 | A1 * | 3/2014 | F24S 10/70 |
| DE | 102014200989 | A1 * | 7/2015 | H01M 2/1077 |
| EP | 1835234 | A2 * | 9/2007 | F24D 3/142 |
| FR | 3011131 | A1 | 3/2015 | |
| JP | 09145072 | A * | 6/1997 | |
| JP | 9145072 | | 6/1998 | |
| JP | 2005090794 | A * | 4/2005 | F28D 15/0275 |
| JP | 2010186970 | A * | 8/2010 | F28D 7/0041 |
| KR | 101168891 | B1 * | 8/2012 | F24D 3/125 |
| WO | 2016129447 | | 8/2016 | |
| WO | 2017087865 | | 5/2017 | |
| WO | 2017197362 | | 11/2017 | |
| WO | 2018044813 | | 3/2018 | |
| WO | 2018112220 | | 6/2018 | |

OTHER PUBLICATIONS

USPTO; International Search Report and Written Opinion for PCT/US17/48955 dated Dec. 26, 2017; 14 pages.
European Patent Office, International Search Report and Written Opinion in PCT/US2019/021692, dated Jul. 24, 2019, 12 pages.
Supplementary European Search Report; EP App No. EP17847319; dated Mar. 31, 2020; 11 pages.
European Patent Office; International Preliminary Report on Patentability for PCT/US19/21692; dated Sep. 24, 2020; 8 pages.

* cited by examiner

LASER COOLING SYSTEM

RELATED APPLICATIONS

This application is a non-provisional of and claims priority benefit to U.S. provisional application Ser. No. 62/382,034, filed Aug. 31, 2016, all of which is incorporated herein in its entirety.

TECHNICAL FIELD

The present disclosure relates to a laser cooling system.

BACKGROUND

The use of laser systems has become widespread in industrial, medical, and other applications. Laser systems may necessitate cooling to improve performance, avoid malfunction, and extend product life. As the amount of laser power increases so does the need to remove larger amounts of heat from the laser system to avoid overheating components that may change their operating characteristics. An increase in temperature may result in an increase in laser wavelength and decrease on power that may compromise a laser system's performance. Since the laser wavelength increases and power decreases with an increase in temperature, the temperature must be uniform throughout the system's laser diode arrays to achieve high overall optical conversion efficiency. Laser diode reliability also decreases with increasing temperature, e.g., lifetime decreases by half for every 10° C. increase in temperature in some instances. A need, therefore, remains for effective mechanisms to remove heat and cool laser systems.

BRIEF DRAWINGS DESCRIPTION

Figure 1B:
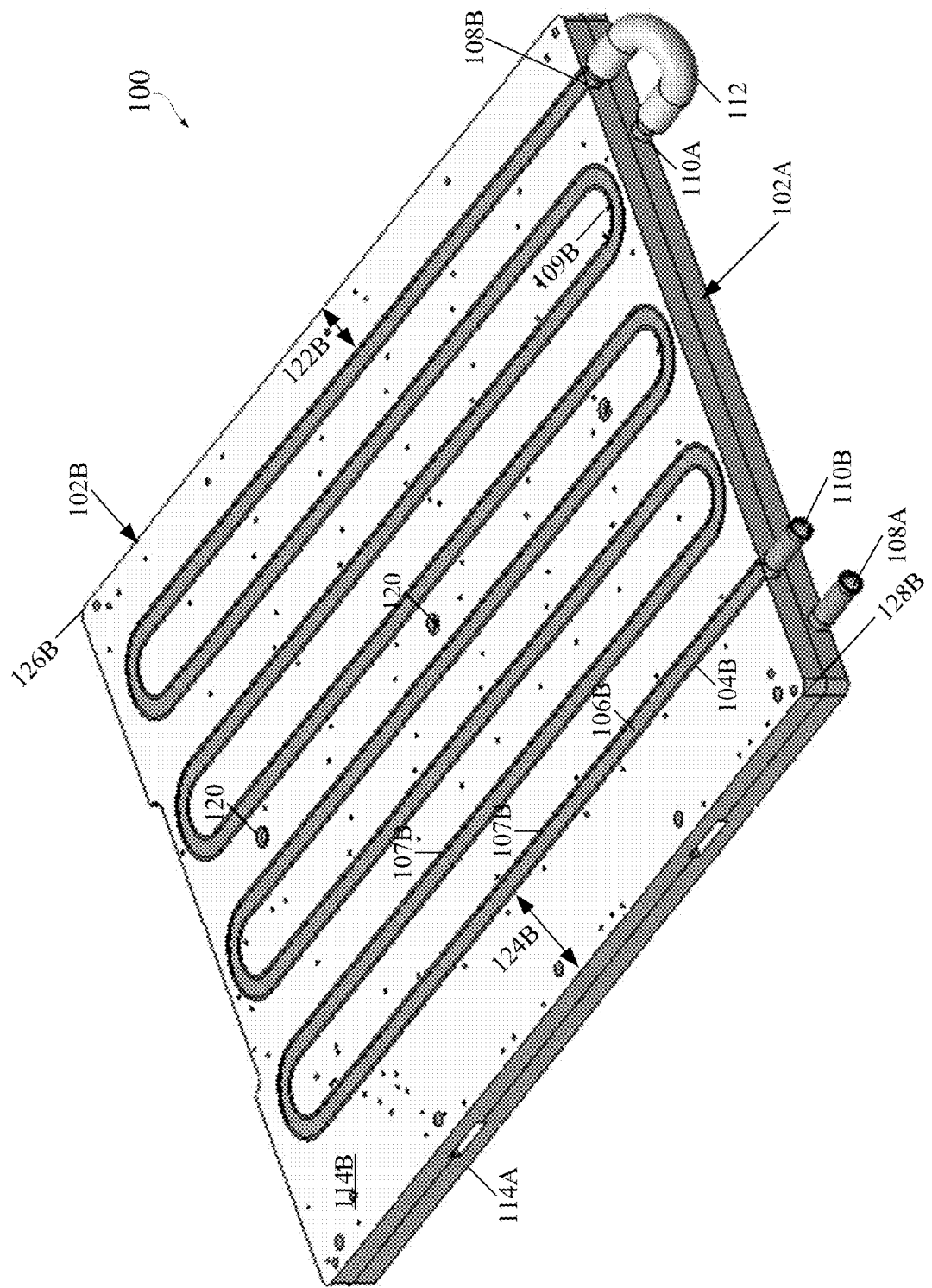
Figure 1C:
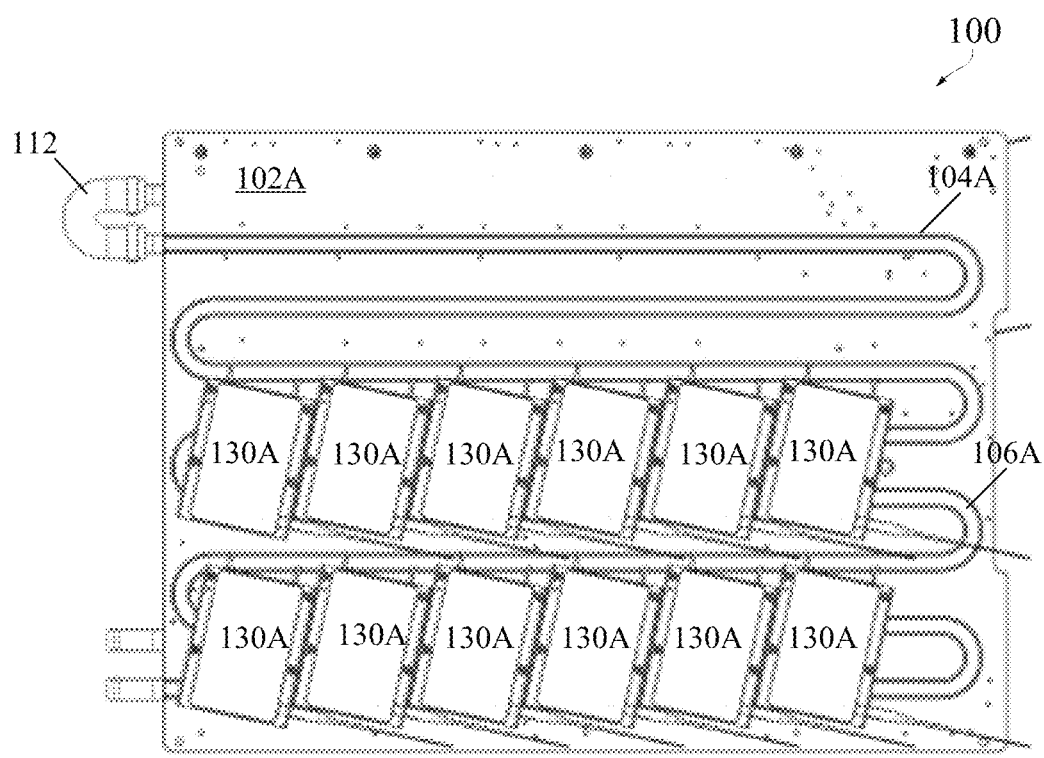
Figure 1D:
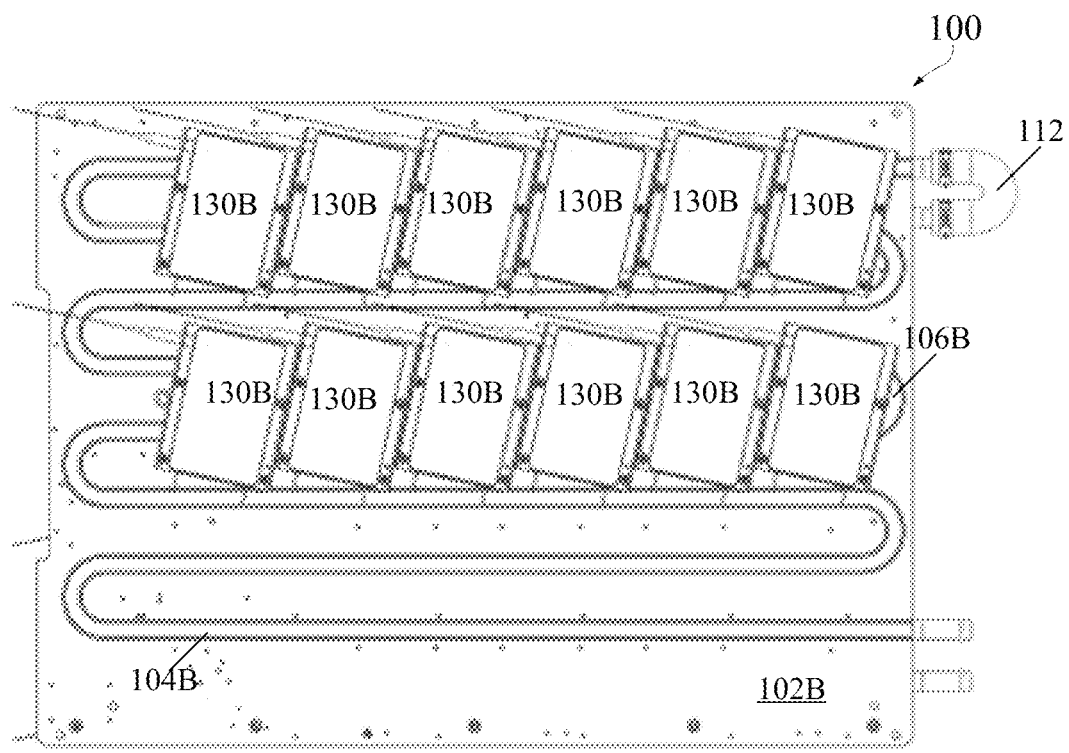
Figure 1E:
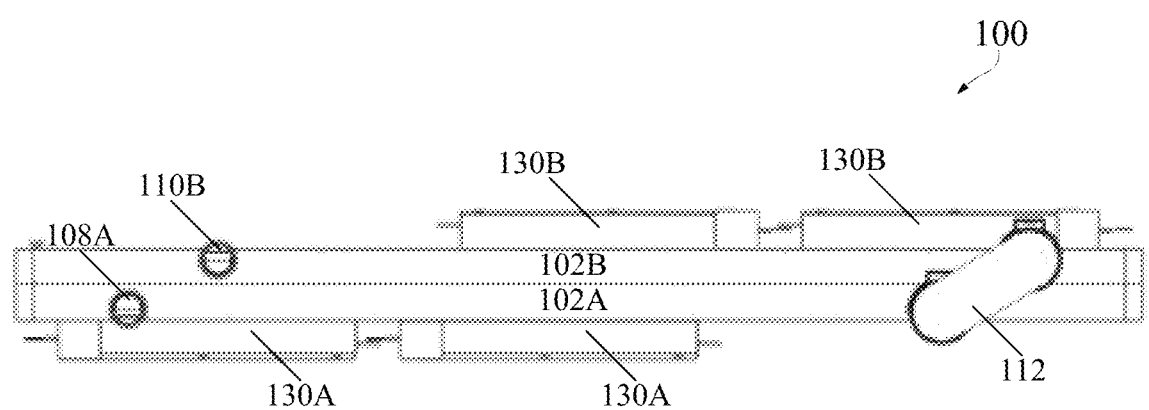
Figure 2A:
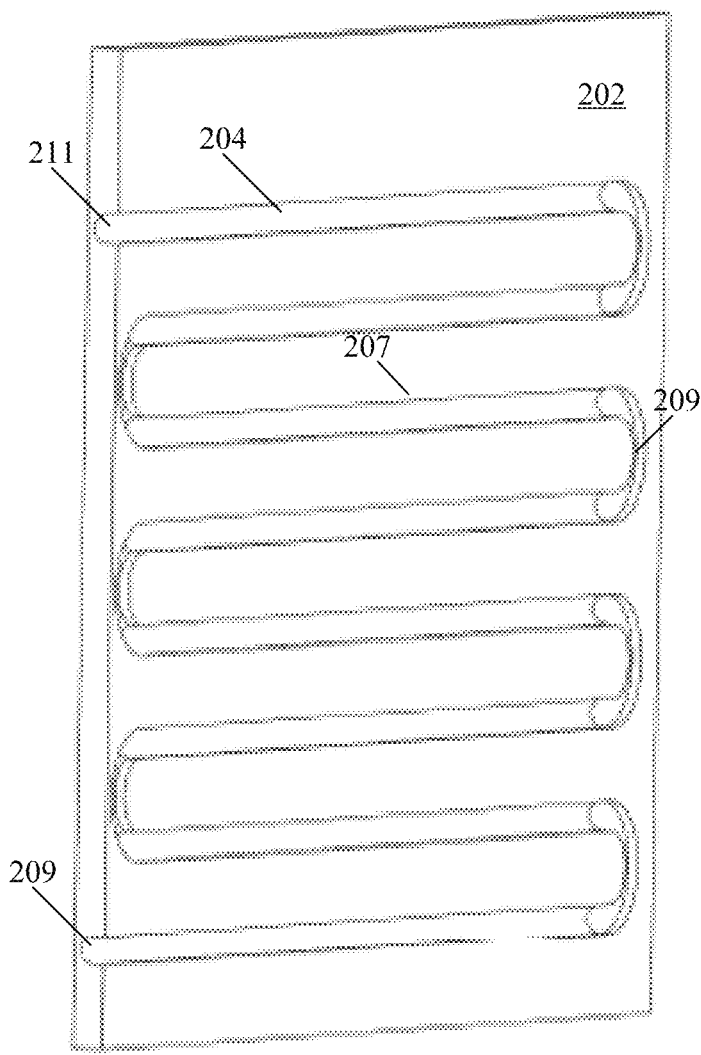
Figure 2B:
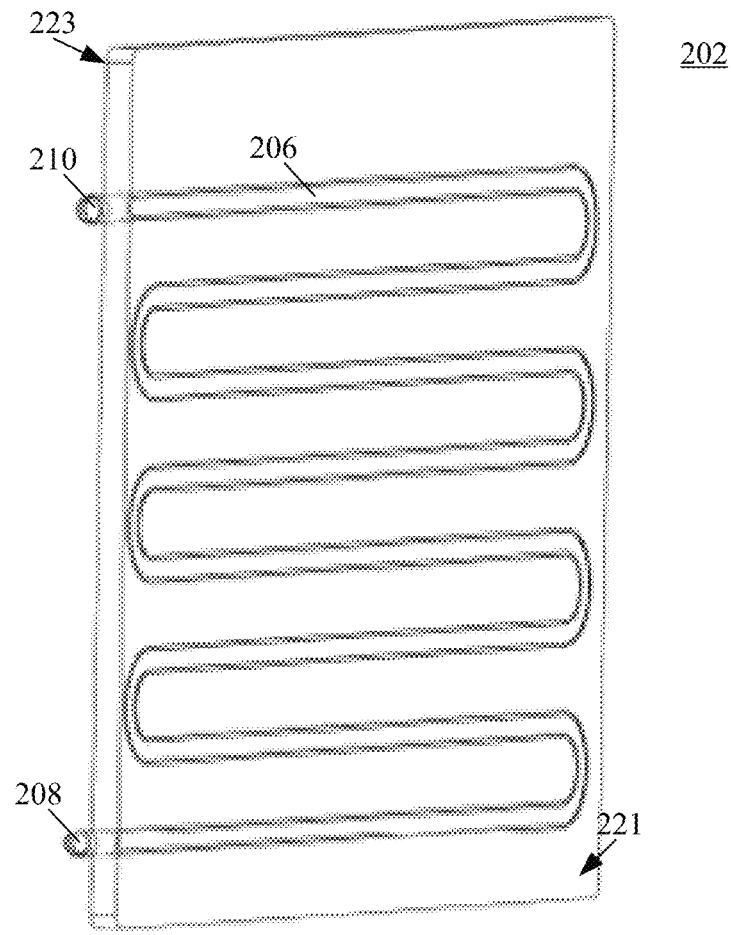
Figure 2C:
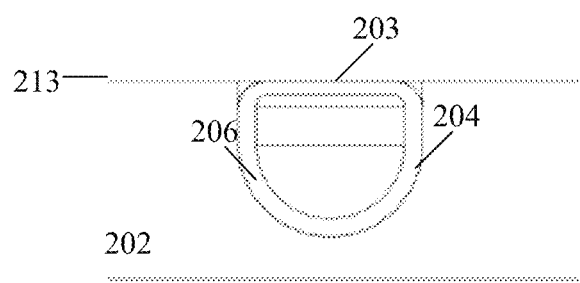
Figure 3A:
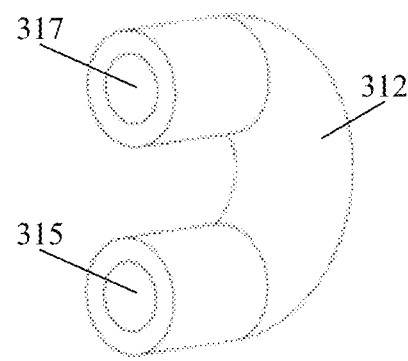
Figure 3B:
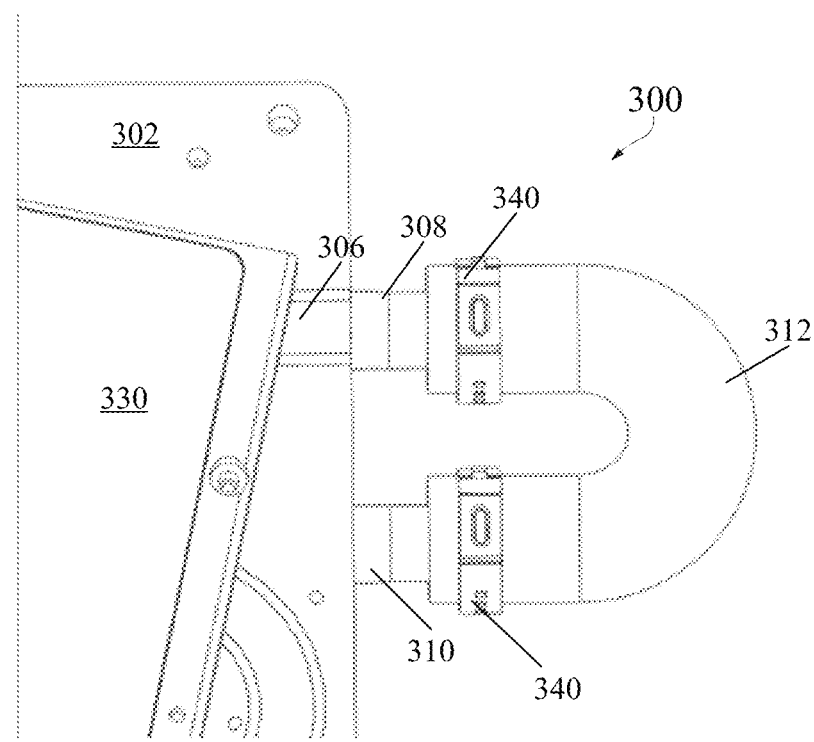
Figure 4:
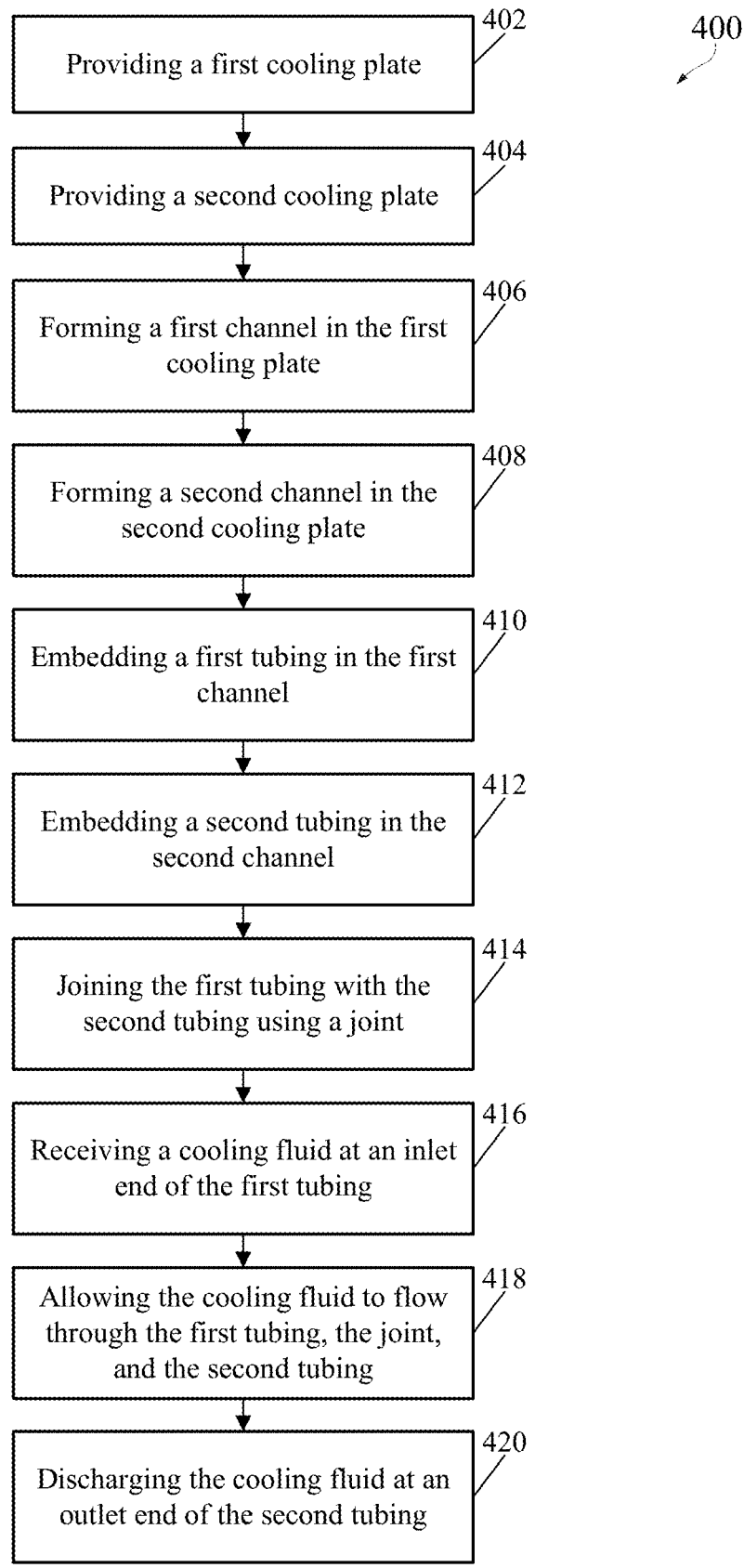
Figure 5:
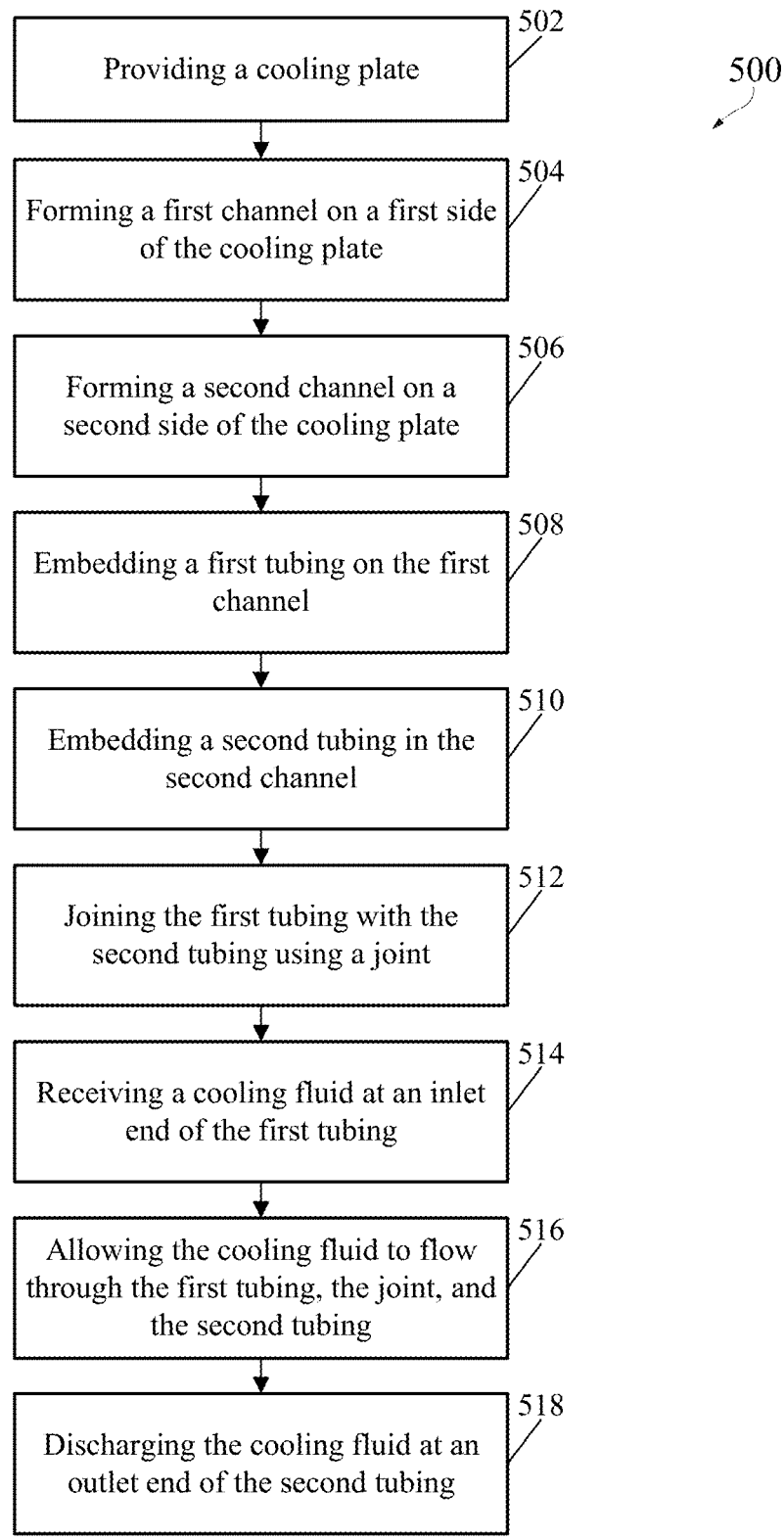

The present disclosure describes various embodiments that may be understood and fully appreciated in conjunction with the following drawings:

FIG. 1A diagrams an embodiment of an exploded view of a cooling system according to the present disclosure;

FIG. 1B diagrams an embodiment of an assembled view of a cooling system according to the present disclosure;

FIG. 1C diagrams an embodiment of a front view of a cooling system with components mounted thereon according to the present disclosure;

FIG. 1D diagrams an embodiment of a back view of a cooling system with components mounted thereon according to the present disclosure;

FIG. 1E diagrams an embodiment of a side view of a cooling system with components mounted thereon according to the present disclosure;

FIG. 2A diagrams an embodiment of a front view of a cooling plate according to the present disclosure;

FIG. 2B diagrams an embodiment of a front view of a cooling plate with tubing embedded therein according to the present disclosure;

FIG. 2C diagrams an embodiment of a side view of a channel formed on a cooling plate with tubing embedded therein according to the present disclosure;

FIG. 3A diagrams an embodiment of a perspective view of a joint according to the present disclosure;

FIG. 3B diagrams an embodiment of a side view of a joint according to the present disclosure;

FIG. 4 diagrams an embodiment of a method for cooling a laser system according to the present disclosure; and FIG. 5 diagrams an embodiment of a method for cooling a laser system according to the present disclosure.

DETAILED DESCRIPTION

The present disclosure describes embodiments with reference to the drawing figures listed above. Persons of ordinary skill in the art will appreciate that the description and figures illustrate rather than limit the disclosure and that, in general, the figures are not drawn to scale for clarity of presentation. Such skilled persons will also realize that many more embodiments are possible by applying the inventive principles contained herein and that such embodiments fall within the scope of the disclosure which is not to be limited except by the claims.

FIG. 1A diagrams an embodiment of an exploded view of a cooling system 100 according to the present disclosure. FIG. 1B diagrams an embodiment of an assembled view of cooling system 100 according to the present disclosure. Referring to FIGS. 1A and 1B, cooling system 100 may include a first cooling plate 102A and a second cooling plate 102B. First cooling plate 102A or second cooling plate 102B may have any shape known to a person of ordinary skill in the art, e.g., square, rectangular, circular, and the like. In an embodiment, first cooling plate 102A or second cooling plate 102B may both have a substantially rectangular shape as shown in FIGS. 1A and 1B.

First cooling plate 102A or second cooling plate 102B may include any thermally conductive material known to a person of ordinary skill in the art. In an embodiment, first cooling plate 102A or second cooling plate 102B may be made of any thermally conductive metal known to a person of ordinary skill in the art, e.g., aluminum.

First cooling plate 102A may include a first channel 104A formed to receive a first tubing 106A. In an embodiment, first cooling plate 102A may include first channel 104A boustrophedonically formed thereon in a continuous manner alternating from right to left to right to left (or up to down to up to down) as shown in FIG. 1A. First channel 106A may include straight portions 107A connected by curved portions 109A. First channel 104A may have any cross-sectional shape known to a person of ordinary skill in the art, e.g., circular, semicircular, square, or the like, to receive first tubing 106A, which may also have any cross-sectional shape known to a person of ordinary skill in the art, e.g., circular, semicircular, square, or the like.

Similarly, second cooling plate 102B may include a second channel 104B formed to receive a second tubing 106B. In an embodiment, second cooling plate 102B may include second channel 104B boustrophedonically formed thereon in a continuous manner alternating from right to left to right to left (or up to down to up to down) as shown in FIG. 1B. Second channel 104B may include straight portions 107B connected by curved portions 109B. Second channel 104B may have any cross-sectional shape known to a person of ordinary skill in the art, e.g., circular, semicircular, square, or the like, to receive second tubing 106B, which may also have any cross-sectional shape known to a person of ordinary skill in the art, e.g., circular, semicircular, square, or the like.

First cooling plate 102A may have a front face 114A and a back face 116A. First channel 104A may extend on front face 114A between a distance 122A from a first edge 126A and a distance 124A from a second edge 128A of first cooling plate 102A. Distance 122A may be smaller, larger, or equal to distance 124A. In an embodiment, distance 122A may be smaller than distance 124A.

Similarly, second cooling plate 102B may have a front face 114B and a back face 116B. Second channel 104B may extend on front face 114B between a distance 122B from a first edge 126B and a distance 124B from a second edge 128B of second cooling plate 102B. Distance 122B may be smaller, larger, or equal to distance 124B. In an embodiment, distance 122B may be smaller than distance 124B. Put differently, first cooling plate 102A and second cooling plate 102B may have similar constructions with corresponding first and second channels 104A and 104B to receive first and second tubing 106A and 106B, respectively.

First cooling plate 102A may removably secure to second cooling plate 102B back face 116A to back face 116B. In an embodiment, first end 126A of first cooling plate 102A may couple to second end 128B of second cooling plate 102B and second end 128A of first cooling plate 102A may couple to first end 126B of second cooling plate 102B. By doing so, first channel 104A on front face 114A offsets second channel 104B on front face 114B to ensure greater cooling efficiency. In an embodiment, first cooling plate 102A may be removably attached or secured to second cooling plate 102B back face 116A to back face 116B using any number or type of fasteners 120 known to a person of ordinary skill in the art, e.g., screws, bolts, nuts, and the like.

First channel 104A may receive first tubing 106A and second channel 104B may receive second tubing 106B. First tubing 106A may have an inlet end 108A and an outlet end 110A that extend beyond an edge of first cooling plate 102A. Second tubing 106B may have an inlet end 108B and an outlet end 110B that similarly extends beyond an edge of second cooling plate 102B.

A joint 112 may removably couple outlet end 110A of first cooling plate 102A to inlet end 108B of second cooling plate 102B. Joint 112 may have any shape known to a person of ordinary skill in the art, e.g., the substantial u-shape shown in FIGS. 1A and 1B. Joint 112 may include any material known to a person of ordinary skill in the art, e.g., rubber, plastic, metal, copper, or the like. Joint 112 may fit removably but securely at a first end 115 over outlet end 110A of first tubing 106A and may fit removably but securely at a second end 117 over inlet end 108B of second tubing 106B. Inlet end 108A may receive cooling fluid 150 of any type known to a person of ordinary skill in the art through any known means. The cooling fluid 150 may travel, propagate, or otherwise flow through first tubing 106A, joint 112, and second tubing 106B. Cooling fluid 150 may discharge at outlet end 110B of second cooling plate 102B. In an embodiment, joint 112 may fit removably but securely fit over outlet end 110A and inlet end 108B using any means known to a person of ordinary skill in the art, e.g., pressure, clamps, rings, and the like. In some embodiments, joint 112 may be soldered, brazed, or otherwise joined to the outlet end 110A and inlet end 108B.

FIG. 1C diagrams an embodiment of a front view of cooling system 100 with components mounted thereon according to the present disclosure. FIG. 1D diagrams an embodiment of a back view of cooling system 100 with components mounted thereon according to the present disclosure. And FIG. 1E diagrams an embodiment of a side view of a cooling system with components mounted thereon according to the present disclosure. Referring to FIGS. 1A-E, cooling system 100 may include first components 130A and second components 130B mounted on first cooling plate 102A and second cooling plate 102B, respectively. First components 130A or second components 130B may include any type of electronic or other devices known to a person of ordinary skill in the art, e.g., laser diode drivers, pump diodes, and the like. First components 130A or second components 130B may each include one or multiple discrete devices. First components 130A or second components 130B may each include single or multiple devices packaged in a single module or housing or packaged in multiple modules or other housings. First components 130A or second components 130B may mount, attach, or otherwise affix to first cooling plate 102A and second cooling plate 102B, respectively, using any type or number of fasteners known to a person of ordinary skill in the art, e.g., screws, bolts, nuts, and the like.

In an embodiment, at least one first component 130A may be mounted over at least one first channel 104A and a corresponding at least one first tubing 106A to ensure that the at least one first component 130A maintains a substantially uniform temperature during operation. In an embodiment, first tubing 106A, through cooling fluid 150 flowing therein, may cool cooling plate 102A that, in turn, may remove heat from components 130A to thereby cool components 130A to ensure a substantially uniform temperature of first components 130A during operation. Similarly, at least one second component 130B may be mounted over at least one second channel 104B and a corresponding at least one second tubing 106B to ensure that the at least one second component 130B maintains a substantially uniform temperature during operation. In an embodiment, second tubing 106B, through cooling fluid 150 flowing therein, may cool cooling plate 102B that, in turn, may remove heat from components 130B to thereby cool components 130B to ensure a substantially uniform temperature of second components 130B during operation.

Cooling fluid 150 flowing through first tubing 106A and second tubing 106B underneath first components 130A and second components 130B cools first cooling plate 102A and second cooling plate 102B to thereby remove heat from first components 130A and second components 130B. Cooling fluid 150 flows on opposite sides of cooling system 100, i.e., through first cooling plate 102A, joint 112, and second cooling plate 102B, such that the coldest cooling fluid 150 is opposite the warmest cooling fluid 150. Thermal crosstalk between first cooling plate 102A and second cooling plate 102B may result in a an averaging effect that leads to improved temperature uniformity across first cooling plate 102A and second cooling plate 102B and hence improved temperature uniformity across first components 130A and second components 130B.

FIG. 2A diagrams an embodiment of a front view of a cooling plate 202 according to the present disclosure. FIG. 2B diagrams an embodiment of a front view of a cooling plate 202 with tubing 206 according to the present disclosure. FIG. 2C diagrams an embodiment of a side view of a channel 204 receiving tubing 206 on a cooling plate 202 according to the present disclosure. Referring to FIGS. 2A-2C, cooling plate 202 includes channel 204 formed thereon through any means known to a person of ordinary skill in the art, e.g., milling, drilling, routing, and the like. In an embodiment, a bit attached to milling, drilling, or routing equipment may define a shape of channel 204. Cooling plate 202 may include any thermally conductive material known to a person of ordinary skill in the art. In an embodiment, cooling plate 202 may be made of any thermally conductive metal known to a person of ordinary skill in the art, e.g., aluminum.

Channel 204 may have any cross-sectional shape and size known to a person of ordinary skill in art as appropriate for the application, e.g., circular, semicircular, square, rectangular, and the like. In an embodiment, cooling plate 202 may have channel 204 formed in a boustrophedonic manner, e.g., in a continuous right to left to right to left (or down to up to down to up), from a channel inlet end 209 to a channel outlet end 211. Channel 204 may have substantially straight portions 207 coupled to curved portions 209 from channel inlet end 209 to channel outlet end 211.

Tubing 206 may have any cross-sectional shape and size known to a person of ordinary skill in the art as appropriate for the application, e.g., circular, semicircular, square, rectangular, and the like. Tubing 206 may be made of any thermally conductive material known to a person of ordinary skill in the art. In an embodiment, tubing 206 may be made of any thermally conductive metal known to a person of ordinary skill in the art, e.g., copper. In an embodiment, tubing 206 may be made of any thermally conductive material that resists internal erosion or corrosion due to cooling fluid 150. Tubing 206 may be embedded into or otherwise received by channel 204 through any means known to a person of ordinary skill in the art, e.g., snapping, pressing, and the like. In an embodiment, tubing 206 may be secured to channel 204 using a thermal epoxy or the like. In an embodiment, receiving or embedding tubing 206 into channel 204 may result in a top 203 of tubing 206 horizontally aligning with a top 213 of cooling plate 202 to provide a flush or flat horizontal surface upon which to mount components over tubing 206 (e.g., first components 130A or second components 130B mounted over tubing 106A and 106B, respectively, as shown in FIGS. 1A-1E). In an embodiment, once channel 204 receives or embeds tubing 206, top 203 of tubing 206 may be milled, filed, or otherwise cut to provide a flush or flat horizontal surface with top 213 of cooling plate 202. In an embodiment in which tubing 206 is secured to channel 204 using a thermal epoxy, the thermal epoxy is likewise milled, filed, or otherwise cut with top 203 to provide a flush or flat horizontal surface with top 213 of cooling plate 202. In another embodiment, once tubing 206 is received or embedded into channel 204, top 203 of tubing 206 may be shaped or pressed to provide a flush or flat horizontal surface with top 213 of cooling plate 202. Tubing 206 may extend beyond cooling plate 202 at an inlet end 208 and an outlet end 210.

In an embodiment, cooling plate 202 may have channels 204 formed on one or both sides. Thus, instead of first cooling plate 102A mounting or securing to second cooling plate 102B as shown in FIG. 1A-1E, cooling plate 202 may include two cooling surfaces 221 or 223. A first cooling surface may be located on a front side 221 and a second cooling surface may be located on an opposing back side 223 with corresponding channels 204 and tubing 206 that provide thermal crosstalk between front side 221 and back side 223 to maintain substantially uniform a temperature of components mounted thereon.

FIG. 3A diagrams an embodiment of a perspective view of a joint 312 according to the present disclosure. FIG. 3B diagrams an embodiment of a side view of joint 312 coupled to a cooling system 300 according to the present disclosure. Referring to FIGS. 1A-1E, 2A-2C, 3A, and 3B, joint 312 may join or otherwise couple tubing 106A to tubing 106B on first cooling plate 102A and second cooling plate 102B, respectively. In the embodiment of FIGS. 2A-2C, joint 312 may join or otherwise couple tubing 206 on a front side 221 of cooling plate 202 to tubing 206 on a back side 223 of cooling plate 202. Joint 312 may have any shape known to a person of ordinary skill in the art, e.g., a substantial u-shape. Joint 312 may include any material known to a person of ordinary skill in the art, e.g., rubber, plastic, or the like. In an embodiment, first end 315 of joint 312 may fit over or otherwise couple to outlet end 310 of tubing 306 and a second end 317 of joint 312 may fit over or otherwise couple to inlet end 308 of tubing 306. Joint 312 may secure to outlet end 310 and inlet end 308 using any fasteners 340 known to a person of ordinary skill in the art, e.g., pressure, rings, clamps, and the like. Joint 312 may allow cooling fluid 150 to flow from tubing 306 on a first side of cooling plate 302 to tubing 306 on a second side of cooling plate 302. Joint 312 may allow the flow of cooling fluid, e.g., fluid 150, to remove heat from components 330. In the embodiment shown in FIGS. 1A-1E, joint 112 may allow cooling fluid 150 to flow from first tubing 106A on first cooling plate 102A to second tubing 106B on second cooling plate 102B.

FIG. 4 diagrams an embodiment of a method 400 for cooling a laser system according to the present disclosure. Referring to FIG. 4, method 400 includes providing a first cooling plate at 402 and providing a second cooling plate at 404. The first cooling plate and the second cooling plate may have any size, shape, or dimensions known to a person of ordinary skill in the art. The first cooling plate and the second cooling plate may include any thermally conductive material known to a person of ordinary skill in the art, e.g., aluminum.

Method 400 further includes forming a first channel in the first cooling plate at 406 and forming a second channel in the second cooling plate at 408 using any means known to a person of ordinary skill in the art, e.g., milling, drilling, routing, or the like.

Method 400 further includes embedding the first tubing in the first channel at 410 and embedding the second tubing in the second channel at 412. The first channel may receive or otherwise embed the first tubing by any means known to a person of ordinary skill in the art, e.g., snapping, pressing, pushing, and the like. Similarly, the second channel may receive or otherwise embed the second tubing by any means known to a person of ordinary skill in the art, e.g., snapping, pressing, pushing, and the like. The first tubing and the second tubing may be secured to the first channel and the second channel, respectively, using any type of adhesive, e.g., thermal epoxy. The first tubing and the second tubing may be pressed or milled into the first channel and the second channel, respectively, to create a substantially flat or flush horizontal surface with the cooling plate. In an embodiment in which the first and the second tubing are secured to the first and second channels, respectively, using an adhesive such as thermal epoxy, the thermal epoxy is likewise milled, filed, or cut to create a substantially flat or flush horizontal surface. In an embodiment, a relatively thin layer of thermal epoxy may cover the first tubing or the second tubing after milling to create a substantially flush or flat horizontal surface with the cooling plate. The first tubing and the second tubing may have any cross-sectional shape or dimensions known to a person of ordinary skill in the art, e.g., circular, semicircular, square, or the like. The first tubing and the second tubing may include any thermally conductive material known to a person of ordinary skill in the art, e.g., copper.

Method 400 may further include joining or otherwise coupling the first tubing with the second tubing using a joint at 414. The joint may have a substantial u-shape and may include any material known to a person of ordinary skill in the art, e.g., rubber, plastic, metal, and the like. The joint may have a first end that fits over an end of the first tubing and a second end that fits over the second tubing. The joint may secure to the first tubing and the second tubing using any means known to a person of ordinary skill in the art, e.g., pressure, rings, clamps, solder, and the like.

Method 400 further includes receiving a cooling fluid at an inlet end of the first tubing at 416. The cooling fluid may be any fluid capable of cooling the cooling plate and thus, removing heat from the system, known to a person of ordinary skill in the art, e.g., water. The inlet end of the first tubing may receive the cooling fluid through any means known to a person of ordinary skill in the art, e.g., fluid source plumbing and the like.

Method 400 further includes allowing the cooling fluid to flow through the first tubing through to the joint to the second tubing to remove heat from components mounted on the cooling plate at 418. Thermal crosstalk between the first tubing on the first cooling plate and the second tubing on the second cooling plate allow maintenance of a substantial uniform temperature across components mounted on the first cooling plate and the second cooling plate.

Method 400 further includes discharging the cooling fluid at an outlet end of the second tubing at 420.

FIG. 5 diagrams an embodiment of a method 500 for cooling a laser system according to the present disclosure. Referring to FIG. 5, method 500 includes providing a cooling plate at 502. The cooling plate may have any size, shape, or dimensions known to a person of ordinary skill in the art. The cooling plate may include any thermally conductive material known to a person of ordinary skill in the art, e.g., aluminum.

Method 500 further includes forming a first channel on a first or front side of the cooling plate at 504 and forming a second channel on a second or back side of the cooling plate at 506 using any means known to a person of ordinary skill in the art, e.g., milling, drilling, routing, or the like.

Method 500 further includes embedding first tubing in the first channel at 508 and embedding second tubing the second channel at 510. The first channel may receive or otherwise embed the first tubing by any means known to a person of ordinary skill in the art, e.g., snapping, pressing, pushing, and the like. Similarly, the second channel may receive or otherwise embed the second tubing by any means known to a person of ordinary skill in the art, e.g., snapping, pressing, pushing, and the like. The first tubing and the second tubing may be pressed or milled into the first channel and the second channel, respectively, to create a substantially flat or flush horizontal surface with a surface of the cooling plate. The first tubing and the second tubing may have any cross-sectional shape or dimensions known to a person of ordinary skill in the art, e.g., circular, semicircular, square, or the like. The first tubing and the second tubing may include any thermally conductive material known to a person of ordinary skill in the art, e.g., copper.

Method 500 may further include joining or otherwise coupling the first tubing with the second tubing using a joint at 512. The joint may have a substantial u-shape and may include any material known to a person of ordinary skill in the art, e.g., rubber, plastic, and the like. The joint may have a first end that fits over an end of the first tubing and a second end that fits over the second tubing. The joint may secure to the first tubing and the second tubing using any means known to a person of ordinary skill in the art, e.g., pressure, rings, clamps, and the like.

Method 500 further includes receiving a cooling fluid at an inlet end of the first tubing at 514. The cooling fluid may be any fluid capable of removing heat known to a person of ordinary skill in the art, e.g., water. The inlet end of the first tubing may receive the cooling fluid through any means known to a person of ordinary skill in the art, e.g., fluid source plumbing and the like.

Method 500 further includes allowing the cooling fluid to flow through the first tubing through to the joint to the second tubing to remove heat from components mounted on the cooling plate at 516. Thermal crosstalk between the first tubing on the first cooling plate and the second tubing on the second cooling plate allow maintenance of a substantial uniform temperature across components mounted on the first cooling plate and the second cooling plate.

Method 500 further includes discharging the cooling fluid at an outlet end of the second tubing at 518.

Person of ordinary skill in the art will appreciate that that the present disclosure is not limited to the disclosure and drawings. Rather, the scope of the present disclosure includes both combinations and sub-combinations of the various features described hereinabove as well as modifications and variations that would occur to such skilled persons upon reading the foregoing description. Only the claims may limit the present disclosure.

The invention claimed is:

1. A system to remove heat generated by first and second components, from the second and first components, during operation of the first and second components, the system comprising:
   a cold plate assembly having a front, a back, and sides, the cold plate assembly further including:
      a first plate having a front, a back, and sides, the front of the first plate including a first channel boustrophedonically formed thereon, the first channel including a channel inlet end and a channel outlet end located at a same side of the sides of the first plate; and
      a second plate attached to the first plate, the second plate having a front, a back, and sides, the front of the second plate including a second channel boustrophedonically formed thereon, the second channel including a channel inlet end and a channel outlet end located at a same side of the sides of the second plate;
      wherein the back of the second plate is attached to the back of the first plate;
   a first tubing received by the front of the first plate, in the first channel, the first tubing having an inlet end and an outlet end located at a same side of the sides of the cold plate assembly, wherein a top of the first tubing and the front of the first plate are located in a first plane;
   a second different tubing received by the front of the second plate, in the second channel, the second tubing having an inlet end and an outlet end located at the side of the sides of the cold plate assembly, wherein a top of the second tubing and the front of the second plate are located in a second plane;
   a joint to couple the outlet end of the first tubing to the inlet end of the second tubing;
   the first components mounted on the front of the first plate over the first tubing, wherein a bottom of the first components are located in the first plane; and
   the second components mounted on the front of the second plate over the second tubing, wherein a bottom of the second components are located in the second plane.

2. The system of claim 1,
   wherein the first components or the second components include a pump diode or a laser diode driver.

3. The system of claim 1,
   wherein the joint is u-shaped; and
   wherein the joint includes rubber or plastic.

4. The system of claim 1, wherein the first channel comprises a single continuous channel, and wherein the second channel comprises a single continuous channel.

5. The system of claim 1, wherein the second channel offsets the first channel.

6. The system of claim 5,
wherein the backs of the plates are thermally coupled to provide thermal crosstalk between the first plate and the second plate via thermal conduction.

7. The system of claim 5,
wherein the first tubing is pressed into the first channel; and
wherein the second tubing is pressed into the second channel.

8. A cooling system to remove heat generated by at least one component, from the at least one component during operation of the at least one component, the cooling system comprising:
a cold plate assembly including a front, a back, and sides, the front having a first channel and the back having a second channel, the first channel including a channel inlet end and a channel outlet end located at a same side of the sides of the cold plate assembly, the second channel including a channel inlet end and a channel outlet end located at the side of the sides of the cold plate assembly;
a first tubing received by the front of the cold plate assembly, in the first channel wherein a top of the first tubing and the front of the cold plate assembly are located in a first plane;
a second different tubing received by the back of the cold plate assembly, in the second channel, wherein a top of the second tubing and the back of the cold plate assembly are located in a second plane;
a joint to removably couple an outlet end of the first tubing to an inlet end of the second tubing, wherein the outlet end of the first tubing and the inlet end of the second tubing are located at the side of the sides of the cold plate assembly; and
the at least one component mounted on the front or the back of the cold plate assembly over the first tubing or the second tubing, respectively, wherein a bottom of the at least one component is located in the first plane or the second plane, respectively;
wherein an inlet end of the first tubing receives a cooling fluid; and
wherein an outlet end of the second tubing discharges the cooling fluid after the cooling fluid flows through the first tubing, the joint, and the second tubing to maintain uniform a temperature of the at least one component mounted on the cold plate assembly.

9. The cooling system of claim 8, wherein the first channel comprises a single continuous channel with straight portions connected by curved portions, wherein the second channel comprises a single continuous channel with straight portions connected by curved portions.

10. The cooling system of claim 8,
wherein the first tubing is pressed into the first channel; and
wherein the second tubing is pressed into the second channel.

11. The cooling system of claim 8,
wherein the cold plate assembly includes a first plate and a second plate, and wherein the front of the cold plate assembly comprises a front of the first plate and the back of the cold plate assembly comprises a front of the second plate, wherein a back of the first plate is attached to a back of the second plate;
wherein the front of the first plate has the first channel boustrophedonically formed thereon, and wherein the first tubing is received by the front of the first plate, in the first channel; and
wherein the front of the second plate has the second channel boustrophedonically formed thereon, and wherein the second tubing is received by the front of the second plate, in the second channel.

12. The cooling system of claim 11,
wherein the first plate or the second plate includes aluminum.

13. A cooling system to remove heat generated by at least one component, from the at least one component during operation of the at least one component, the cooling system comprising:
a cold plate assembly having a front with a first planar surface, a back with a second planar surface, and sides;
a channel formed on the front of the cold plate assembly, the channel including a channel inlet end and a channel outlet end located at a same side of the sides of the cold plate assembly; and
a tubing having an inlet end and an outlet end located at the side of the sides of the cold plate assembly, the tubing having a planar side, the tubing disposed in the channel to expose the planar side;
the tubing received by the front of the cold plate assembly, in the channel, wherein the first planar surface of the front of the cold plate assembly is defined, at least in part, by the exposed planar side of the tubing;
wherein the at least one component is directly mounted to the first planar surface.

14. The cooling system of claim 13, wherein the channel comprises a single continuous channel with straight portions connected by curved portions.

15. The cooling system of claim 13, wherein the at least one component is directly mounted to the first planar surface over the exposed planar side of the tubing.

16. The cooling system of claim 13, wherein the channel comprises a first channel and the tubing comprises a first tubing, and the cooling system further comprises:
a second channel formed on the back of the cold plate assembly, the second channel including a channel inlet end and a channel outlet end located at the side of the sides of the cold plate assembly; and
a second different tubing having an inlet end and an outlet end located at the side of the sides of the cold plate assembly, the second tubing having a planar side, the second tubing disposed in the second channel to expose the planar side of the second tubing;
the second tubing received by the back of the cold plate assembly, in the second channel, wherein the second planar surface of the back of the cold plate assembly is defined, at least in part, by the exposed planar side of the second tubing.

17. The cooling system of claim 16, further comprising:
a joint to removably couple the outlet end of the first tubing to the inlet end of the second tubing;
wherein the inlet end of the first tubing receives a cooling fluid; and
wherein the outlet end of the second tubing discharges the cooling fluid after the cooling fluid flows through the first tubing, the joint, and the second tubing.

18. The cooling system of claim 17, the cooling system further configured to remove heat generated by an additional at least one component, from the additional at least one component, during operation of the additional at least one component, wherein the additional at least one component is directly mounted to the second planar surface.

19. The cooling system of claim 18, wherein the at least one component is directly mounted to the first planar surface over the exposed planar side of the first tubing, and wherein the additional at least one component is directly mounted to the second planar surface over the exposed planar side of the second tubing.

* * * * *